United States Patent

Surlekar et al.

[11] Patent Number: 6,115,295
[45] Date of Patent: *Sep. 5, 2000

[54] EFFICIENT BACK BIAS ($V_{BB}$) DETECTION AND CONTROL SCHEME FOR LOW VOLTAGE DRAMS

[75] Inventors: Vipul Surlekar, Malad, India; Sadashiva Rao, Santa Clara, Calif.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/993,798

[22] Filed: Dec. 18, 1997

[51] Int. Cl.$^7$ ........................................... G11C 7/00
[52] U.S. Cl. ........................... 365/189.09; 365/230.08
[58] Field of Search ....................... 365/189.09, 230.08

[56] References Cited

U.S. PATENT DOCUMENTS

| | | | |
|---|---|---|---|
| 4,581,718 | 4/1986 | Oishi | 365/230.08 |
| 5,065,091 | 11/1991 | Tobita | 324/158 |
| 5,315,557 | 5/1994 | Kim et al. | 365/189.09 |
| 5,721,510 | 2/1998 | Miyajima | 327/536 |

*Primary Examiner*—Trong Phan
*Assistant Examiner*—M. Tran
*Attorney, Agent, or Firm*—Frank D. Cimino; W. James Brady; Frederick J. Telecky, Jr.

[57] ABSTRACT

An efficient back bias ($V_{BB}$) detection and control circuit make possible a low voltage memory device and includes an on-chip $V_{BB}$ level sensor (38) that includes a dynamic voltage reference shift circuit (40, 42, 44, 46) for establishing a first voltage level ($-(|2\ VTP|+VTN)$) during power-up and a second voltage level ($-|2\ VTP|$) during normal operation. The first voltage level is of a deeper level for achieving a short power-up interval. The second voltage level has a level less deep than said first voltage for achieving low power operation.

36 Claims, 1 Drawing Sheet

EFFICIENT BACK BIAS (V$_{BB}$) DETECTION AND CONTROL SCHEME FOR LOW VOLTAGE DRAMS

This is a Non Provisional application filed under 35 USC 119(e) and claims priority of India application, Ser. No. 1714/MAS/97 of inventor Surlekar, et al, filed Jul. 31, 1997.

TECHNICAL FIELD OF THE INVENTION

The present invention relates to integrated circuits systems that include integrated circuits and, more particularly, to memory circuits such as dynamic random access memory (DRAM) circuits and, even more particularly, to back bias (V$_{BB}$) detection and control schemes for low voltage DRAM circuits.

BACKGROUND OF THE INVENTION

Achieving proper operation of a memory circuit, such as a DRAM, typically requires an initial pause of 200 μsec followed by a minimum of eight initialization cycles after reaching the full V$_{CC}$ level. Within the generally specified power-up pause of 200 μsec, reliable DRAM operation demands on-chip generated back bias voltage (V$_{BB}$). Providing the needed V$_{BB}$ reduces junction capacitance, reduces substrate leakage and prevents forward biasing of junctions. Generating a deep V$_{BB}$ level within the specified power-up, however, becomes difficult at low operating voltages (e.g., approximately 3.3V). This is particularly true if the V$_{BB}$ load capacitance is high, such as is the case for sub-micron technologies and higher DRAM densities. For instance, the typical V$_{BB}$ load capacitance of a 16 Mb DRAM employing trench capacitor cells as storage elements is about 240 nf.

One type of circuit design for initializing and enabling peripheral circuits on a memory chip generates internally a positive pulse RID(RAS_Input Disable). In this circuit, RID is designed to go positive as soon as power-on conditions are detected and reset when V$_{BB}$ reaches a preset level. The resetting is usually accomplished by means of an analog sensor, which detects when the V$_{BB}$ level is 2 Vtn below-ground. For example, TABLE 1 documents RID trip points for the 16 Mb shrink (16 MS) low voltage (3.3V) DRAM fabricated using 0.5 μm technology. As TABLE 1 shows, RID reset is marginal to the power-up specification of 200 μs at 2.6V, 100° C. and using a MSIG (minus sigma) process model.

TABLE 1

| 16MS SIMULATION RESULTS | | |
|---|---|---|
| SIMULATION CONDITIONS/MODEL | RID TRIP POINT | VBB @ RID |
| 2.6V, 100C\|MSIG | 203 us | −0.89V |
| 4.0V, −10C\|PSIG | 45 us | −1.12V |

Of particular importance is the fact that if RID is not reset within the power-up spec time, then the device operation cannot be guaranteed.

In other words, this method uses RID to manipulate V$_{BB}$ pumping during power-up in the memory device. RID is made a function of V$_{BB}$, through a predetermined level sensor. V$_{BB}$ pumping starts as soon as power-on is detected and stops after RID is reset. Such a scheme may be inadequate for low voltage operations, because at 16 MB densities, higher substrate capacitances result. Thus, V$_{BB}$ may not reach a deep enough level to reset RID. This will keep the device in initialization mode, and prohibit normal memory device operation.

One method to reset RID expeditiously is to pump harder the V$_{BB}$, SO that RID reset is not marginal to spec. Usually, V$_{BB}$ pumping during power-up is stopped after RID is reset. This method extends pumping beyond RID reset so that the V$_{BB}$ level is deep on power-up. As the process models/operating conditions change, if pumping is extended uncontrolled, V$_{BB}$ becomes too deep and may adversely affect memory device operation.

SUMMARY OF THE INVENTION

In light of the above limitations, there is a need for an improved memory device initialization circuit that avoids the limitations by providing a sufficiently deep and prompt back bias supply for a memory device during power-up, but which back bias supply is not too deep for normal low voltage operation.

The present invention, therefore, provides a back bias control circuit for a memory device, such as a DRAM, that eliminates or substantially reduces the slow and low voltage power-up problems affecting known back bias supply circuits.

According to one aspect of the invention, there is provided an efficient back bias (V$_{BB}$) detection and control circuit that makes possible a low voltage memory device and thus includes an on-chip V$_{BB}$ level sensor having a dynamic voltage reference shift circuit for establishing a first voltage level during power-up and a second voltage level during normal operation. The first voltage is of a deeper level to achieve a short power-up interval. The second voltage level is of a level less deep than the first voltage for achieving low power operation.

According to another aspect of the invention, there is provided an on-chip V$_{BB}$ level sensor that chooses a −(|2 VTP|+VTN) reference during power-up and a −(|2 VTP|) reference after power-up. A power-up complete signal is combined with the sensor output to conditionally bypass the extra N-channel transistor in the sensor circuit, thus changing the sensing level from −(|2VTP|+VTN) to −(|2 VTP|) dynamically. The sensor output is used to keep the pumps, including a booster pump, a high power pump, and a low power pump, for example, enabled until a deep V$_{BB}$ condition is detected. This quickens the substrate pumping enabling us to achieve deeper VBB level in a shorter time interval. The feedback path ensures that until the power-up condition is reached, −(|2 VTP|+VTN) sensing is enabled. The on-chip V$_{BB}$ detection and control circuit cuts off all extra pumping once deep V$_{BB}$ is sensed by the sensor. Once the memory device reaches the powered-up condition, the present invention enables the feedback path to N-channel transistor. This results in bypassing the N-channel transistor. From this point onward, only the −(|2 VTP|) reference level appears in the sensor input path.

A technical advantage of the present invention is its use of an on-chip oscillator that helps low power operation. The on-chip oscillator makes use of the dynamically reconfigured −(2 VTP) level sensor (described above), during normal operation.

A technical advantage of the present invention is that it provides for RID resetting at a relatively shallow V$_{BB}$ level. The present invention, therefore, allows the device to initialize within the specified time for the DRAM and pumps are not cut off. This allows V$_{BB}$ to reach a deep level.

Other technical advantages that the present invention provides is achieving desired (deep) V$_{BB}$ level with shorter power-up interval, and reconfiguring of the same sensor for low power operation once the sensor circuit detects the powered-up condition.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGUREs like numerals being used to refer to like and corresponding parts of the various drawings.

Figure 1:
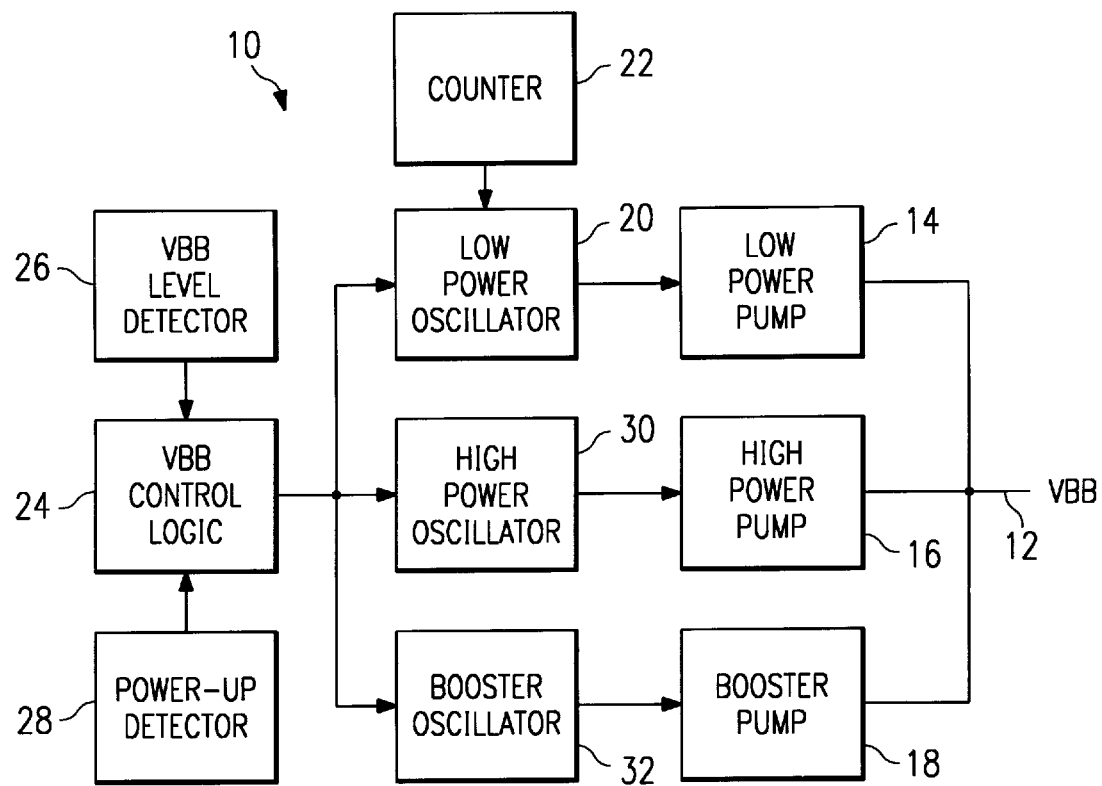
FIG. 1 is a block diagram of a $V_{BB}$ generation system of the present invention.

FIG. 1 shows $V_{BB}$ control circuit 10 of the present invention for generating and regulating the back bias voltage level for an associated memory device, such as a DRAM. In $V_{BB}$ control circuit 10, the $V_{BB}$ voltage level output 12 is controlled by the combined outputs of low power pump circuit 14, high power pump circuit 16, and booster pump circuit 18. Low power oscillator 20 receives input from counter circuit 22 and $V_{BB}$ control logic circuit 24, which receives input from $V_{BB}$ level detector circuit 26 and power-up detector circuit 28. $V_{BB}$ control logic circuit 24 also feeds high power oscillator circuit 30 and booster oscillator circuit 32. High power oscillator circuit 30 provides input to high power pump 16, while booster pump circuit 18 receives input from booster oscillator circuit 32.

Low power pump circuit 14 supplies current that is generally consumed by substrate leakage, when the device is in the standby mode of operation. High power pump circuit 16 supplies substrate current during the active cycle of $V_{BB}$ control circuit 10. Booster pump circuit 18 provides a boost voltage during initial power-up, as well as in the event that $V_{BB}$ goes shallow. Variable frequency, low power oscillator 20 pumps low power pump circuit 14. High frequency, high power oscillator 30 pumps high power pump circuit 16, while booster oscillator circuit 32 pumps booster pump circuit 18. Low power pump circuit 14 and high power pump circuit 16 also pump $V_{BB}$ during initial power-up.

Variable frequency, low power oscillator circuit 20 provides low power operation, with its frequency varying according to the $V_{BB}$ level. The deeper the $V_{BB}$ level, the lower the oscillator frequency and, therefore, the lower the power consumption. The low power oscillator works off a $-2$ Vtp $V_{BB}$ level sensor to control its frequency.

Figure 2:
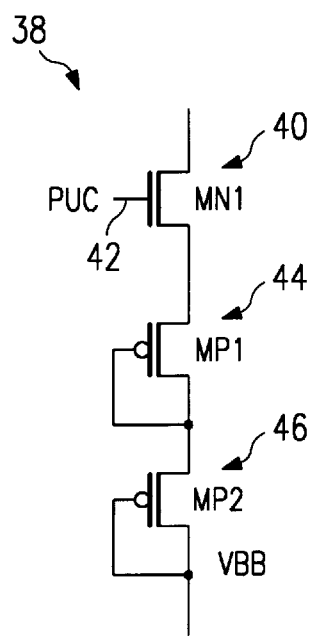
FIG. 2 is a schematic diagram of a sensor circuit used in the low power oscillator of FIG. 1.

Counter circuit 22 counts a fixed time interval after RID reset. The counter count output from counter circuit 22 determines the amount of time for which pumping is to be extended. FIG. 2 shows one embodiment of level sensor circuit 38 of the present invention, which is part of low power oscillator circuit 20. Level sensor circuit 38 includes N-channel transistor 40 that receives a power-up complete signal at line 42. Level sensor circuit 38 also includes P-channel transistors 44 and 46. After the memory device power supply is turned on, power up complete (PUC) signal on line 42 is low and the level sensor circuit 38 is configured for sensing a level of $-(2\ Vtp+Vtn)$.

The PUC signal can go high under two conditions. One condition is when RID goes low and the counter circuit 22 preset count is complete. The other condition is when $V_{BB}$ value goes below $-(2\ Vtp+Vtn)$. In the first condition, PUC signal 42 goes high and N-channel transistor 40 is fully turned on. At this point, the sensor is configured for $-2$ Vtp detection. In the second case, a $V_{BB}$ level below $-(2\ Vtp+Vtn)$ is detected which, in turn, causes PUC signal 42 to go high and configures level sensor circuit 38 for $-2$ Vtp detection. While the first case occurs at the slow corner (low voltage and slow process parameters) of the circuit characteristic curve, the second case occurs at the fast corner (high voltage and fast process parameters) of the circuit characteristic curve.

For level sensing circuit 38, the sensing level of $-(2\ Vtp+Vtn)$ keeps an upper bound on the $V_{BB}$. This avoids the problem of $V_{BB}$ going too deep at the fast corner. After power-up is complete, the sensing level of $-(2\ Vtp+Vtn)$ is no longer necessary and a sensing level of $-2$ Vtp is sufficient to control the low power oscillator 20.

After power-up, N-channel transistor 40 fully turns on and the sensing level dynamically changes from $-(2\ Vtp+Vtn)$ to $-2$ Vtp. The dynamic reconfiguration of the $-(2\ Vtp+Vtn)$ sensor allows using the same sensor both during power-up and during normal operation. This eliminates the need for two different sensors, thereby saving leakage current, and ultimately lowering power operation.

TABLE 2 shows the simulation results for one embodiment of the present invention to illustrate the effect of the present invention with a 16 MB shrink low voltage (3.3V) DRAM.

TABLE 2

Simulation Results of Invention

| SIMULATION CONDITIONS/MODEL | RID TRIP POINT | $V_{BB}$ @ RID | $V_{BB}$ @ PUC |
|---|---|---|---|
| 2.6V, 100C\|MSIG | 123 us | −0.95V | −1.22V |
| 3.3V, 27C\|MEAN | 60 us | −1.15V | −1.54V |
| 4.0V, −10C\|PSIG | 32 us | −1.20V | −1.78V |

To summarize, the present invention provides an on-chip $V_{BB}$ level sensor that chooses a $-(|2\ VTP|+VTN)$ reference during power-up and a $-(|2\ VTP|)$ reference after power-up. With the present invention, a power-up complete signal is combined with the sensor output to conditionally bypass the extra N-channel transistor in the sensor circuit. This dynamically changes the sensing level from $-(|2\ VTP|+VTN)$ to $-(|2\ VTP|)$. Sensor circuit 38 of the preferred embodiment provides output that keeps the pump circuits 14, 16, and 18 enabled during power-up until it detects a deep $V_{BB}$ condition. This makes substrate pumping faster, thereby permitting a deeper $V_{BB}$ level in a shorter time interval. The feedback path that the present invention provides ensures that until the memory device reaches the powered-up condition $-(|2VTP|+VTN)$ sensing is enabled. The present invention cuts off extra pumping once sensor circuit 38 senses deep $V_{BB}$. Once the memory device reaches powered-up condition, the feedback path to N-channel transistor is permanently enabled, and thereby bypassed. From this point onward, only the $-(|2\ VTP|)$ reference level appears in the sensor path. Sensor circuit 38 preferably resides on-chip in low power oscillator and helps low power operation. Thus $V_{BB}$ is pumped deeper during power-up.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. An efficient back bias ($V_{BB}$) voltage generating circuit for providing the $V_{BB}$ voltage on an integrated circuit, comprising:

an on-chip $V_{BB}$ generating circuit coupled to a $V_{BB}$ voltage terminal to establish a $V_{BB}$ voltage having a first voltage level during power-up, and to establish the $V_{BB}$ voltage having a second voltage level during normal operation, said first voltage level having a first magnitude and said second voltage level having a second magnitude smaller than said first magnitude.

2. The circuit of claim 1, wherein said first voltage level is more negative than said second voltage level.

3. The circuit of claim 2, wherein the first voltage level approximately equals $-(|2\ VTP|+VTN)$ and wherein the second voltage level approximately equals $-(|2\ VTP|)$.

4. The circuit of claim 1, wherein the on-chip $V_{BB}$ generating circuit includes a $V_{BB}$ level sensor and a $V_{BB}$ voltage generator, and wherein the first voltage level of the $V_{BB}$ voltage is established by the $V_{BB}$ level sensor sensing when the $V_{BB}$ voltage reaches the first voltage level and then controlling the $V_{BB}$ voltage generator accordingly, and wherein the second voltage level of the $V_{BB}$ voltage is established by the $V_{BB}$ level sensor sensing when the $V_{BB}$ voltage reaches the second voltage level and then controlling the $V_{BB}$ voltage generator accordingly.

5. The circuit of claim 4, wherein the $V_{BB}$ level sensor dynamically shifts from sensing when the $V_{BB}$ voltage reaches the first voltage level to sensing when the $V_{BB}$ voltage reaches the second voltage level in response to a signal indicating that the power-up is complete.

6. The circuit of claim 4, wherein the $V_{BB}$ level sensor dynamically shifts from sensing when the $V_{BB}$ voltage reaches the first voltage level to sensing when the $V_{BB}$ voltage reaches the second voltage level in response to a signal indicating that the $V_{BB}$ voltage has reached the first voltage level.

7. The circuit of claim 1, further comprising circuitry for dynamically shifting the on-chip $V_{BB}$ voltage generation circuitry from establishing the first voltage level to establishing the second voltage level in response to a power-up complete signal.

8. The circuit of claim 1, further comprising circuitry for dynamically shifting the on-chip $V_{BB}$ voltage generation circuit from establishing the first voltage level to establishing the second voltage level in response to a signal indicating that the $V_{BB}$ voltage has reached the first voltage level.

9. The circuit of claim 1, wherein the on-chip $V_{BB}$ generating circuit comprises:

a first pump circuit having an output connected to the $V_{BB}$ voltage terminal and operating to generate the $V_{BB}$ voltage during a standby mode of operation;

a second pump circuit having an output connected to the $V_{BB}$ voltage terminal and operating to generate the $V_{BB}$ voltage during the normal operation.

10. The on-chip $V_{BB}$ generating circuit of claim 9 further comprising:

a third pump circuit having an output connected to the $V_{BB}$ voltage terminal and operating to generate the $V_{BB}$ voltage during the power-up.

11. The on-chip $V_{BB}$ generating circuit of claim 9 further comprising:

a low power oscillator circuit connected to the first pump circuit and generating a variable frequency oscillation signal at its output, and wherein the variable frequency of the low power oscillator signal varies according to the level of the $V_{BB}$ voltage.

12. The circuit of claim 1, wherein the on-chip $V_{BB}$ generating circuit comprises:

a first pump circuit having an output connected to the $V_{BB}$ voltage terminal and operating to generate the $V_{BB}$ voltage during the power-up; and a second pump circuit having an output connected to the $V_{BB}$ voltage terminal and operating to generate the $V_{BB}$ voltage during the normal operation.

13. The circuit of claim 12, wherein the first pump circuit operates to generate the $V_{BB}$ voltage only during the power-up.

14. The circuit of claim 1, wherein the on-chip $V_{BB}$ generating circuit includes a $V_{BB}$ level sensor comprising:

a first diode-connected transistor connected between the $V_{BB}$ voltage terminal and a first node;

a second transistor having its current path connected between the first node and a detector output node, and wherein the gate of the second transistor is connected to a control signal, the control signal being at an inactive voltage level during the power-up thereby allowing the second transistor to turn on only if the $V_{BB}$ voltage reaches a particular threshold level, and the control signal being at an active voltage level during the normal operation thereby turning the second transistor on regardless of the level of the $V_{BB}$ voltage.

15. The circuit of claim 14, wherein the active voltage level is a high logic level and the inactive voltage level is a low logic level.

16. The circuit of claim 15, wherein the first diode connected transistor is a P-channel transistor with its gate connected to the $V_{BB}$ voltage terminal, and wherein the second transistor is a N-channel transistor.

17. The circuit of claim 1, wherein the integrated circuit comprises a low voltage dynamic random access memory (DRAM) device.

18. A method of generating and controlling a pumped voltage having a level outside of the typical logic voltage range between Vss and $V_{DD}$ of an integrated circuit comprising:

generating the pumped voltage on the integrated circuit having a first voltage level during power-up;

generating the pumped voltage on the integrated circuit having a second voltage level during normal operation; and wherein the first voltage level has a first magnitude and the second voltage level has a second magnitude, and wherein the first magnitude is greater than the second magnitude.

19. The method of claim 18, wherein the pumped voltage is a back bias ($V_{BB}$) voltage, and wherein said first voltage level is more negative than said second voltage level.

20. The method of claim 18, wherein the step of generating the pumped voltage having a first voltage level during power-up comprises limiting the pumped voltage to the first voltage level.

21. The method of claim 18, wherein the step of generating the pumped voltage having a second voltage level during normal operation comprises limiting the pumped voltage to the second voltage level.

22. The method of claim 21 wherein the steps of limiting the pumped voltage to the first voltage level during the power-up and limiting the pumped voltage to the second voltage level during the normal operation comprises:

sensing the pumped voltage with a level detection circuit during the power-up and generating a detection signal only when the pumped voltage reaches the first voltage level; and sensing the pumped voltage with the level detection circuit during the normal operation and generating the detection signal only when the pumped voltage reaches the second voltage level.

23. The method of claim 22, wherein the level detection circuit only generates the detection signal when the pumped voltage reaches the threshold level of the level detection circuit, and wherein the threshold level of the level detection circuit is equal to the first voltage level during the power-up and the threshold level of the detection circuit is altered after the power-up is completed such that during the normal operation the level detection circuit generates the detection signal only when the pumped voltage reaches the second voltage level.

24. The method of claim 18, wherein the step of limiting the pumped voltage to the second voltage level during the normal operation is performed in response to a control signal indicating that the power-up is complete.

25. The method of claim 18, wherein the step of limiting the pumped voltage to the second voltage level during the normal operation is performed in response to a control signal indicating that the pumped voltage has reached the first voltage level.

26. The method of claim 18, wherein the steps of generating the pumped voltage include operating a first voltage pump during the normal operation and operating a booster pump during the power-up.

27. The method of claim 18, wherein the integrated circuit comprises a low voltage dynamic random access memory (DRAM) device.

28. A voltage control circuit comprising:

an on-chip voltage level sensor coupled to a voltage terminal having a pumped voltage thereon to sense and limit the pumped voltage to a first voltage level during a first mode of operation, and to sense and limit the pumped voltage to a second voltage level during a second mode of operation, said first voltage level having a first magnitude, and said second voltage level having a second magnitude smaller than said first magnitude.

29. The voltage control circuit of claim 28, wherein the pumped voltage is a back bias ($V_{BB}$) voltage and said first voltage level is more negative than said second voltage level.

30. The voltage control circuit of claim 29, wherein the first voltage level approximately equals $-(|2\ VTP|+VTN)$ and said second voltage level approximately equals $-(|2\ VTP|)$.

31. The voltage control circuit of claim 28, wherein the magnitude of the first voltage level is greater than the magnitude of the second voltage level by approximately one VT of a transistor located in the on-chip voltage level sensor.

32. The voltage control circuit of claim 31, wherein the transistor is an N-channel transistor.

33. The voltage control circuit of claim 32, wherein the on-chip voltage level sensor dynamically shifts from sensing and limiting the pumped voltage to the first voltage level to sensing and limiting the pumped voltage to the second voltage level in response to a signal being received at the gate of the N-channel transistor indicating that the first mode of operation is complete.

34. The voltage control circuit of claim 28, wherein the on-chip voltage level sensor dynamically shifts from sensing and limiting the pumped voltage to the first voltage level to sensing and limiting the pumped voltage to the second voltage level in response to a signal indicating that the first mode of operation is complete.

35. The voltage control circuit of claim 28, wherein the first mode of operation is power-up and the second mode of operation is normal operation.

36. The voltage control circuit of claim 35, further comprising:

a first pump circuit having an output connected to the voltage terminal and operating to generate the pumped voltage during the power-up; and a second pump circuit having an output connected to the voltage terminal and operating to generate the pumped voltage during the normal operation.

* * * * *